United States Patent
Maruo

(10) Patent No.: US 7,864,147 B2
(45) Date of Patent: Jan. 4, 2011

(54) METHOD AND APPARATUS FOR DRIVING CAPACITIVE LOAD, AND LCD

(75) Inventor: Akimasa Maruo, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 776 days.

(21) Appl. No.: 11/719,250

(22) PCT Filed: Jan. 11, 2006

(86) PCT No.: PCT/JP2006/000570
§ 371 (c)(1),
(2), (4) Date: May 14, 2007

(87) PCT Pub. No.: WO2006/075768

PCT Pub. Date: Jul. 20, 2006

(65) Prior Publication Data
US 2009/0140779 A1    Jun. 4, 2009

(30) Foreign Application Priority Data

Jan. 11, 2005 (JP) ............................. 2005-003403
Aug. 24, 2005 (JP) ............................. 2005-242086

(51) Int. Cl.
*G09G 3/36* (2006.01)
(52) U.S. Cl. .......................................... 345/90; 345/91
(58) Field of Classification Search ................. 345/211, 345/90, 91
See application file for complete search history.

(56) References Cited

U.S. PATENT DOCUMENTS

| 5,892,493 A * | 4/1999 | Enami et al. ................... 345/94 |
| 7,138,972 B2 * | 11/2006 | Ito et al. ........................ 345/89 |
| 2003/0122812 A1 * | 7/2003 | Onozawa et al. ............ 345/211 |
| 2004/0085332 A1 | 5/2004 | Nakaoka et al. |

FOREIGN PATENT DOCUMENTS

| JP | 04-371995 A | 12/1992 |
| JP | 08-223016 A | 8/1996 |
| JP | 2004-093951 A | 3/2004 |
| JP | 2004-145185 A | 5/2004 |

OTHER PUBLICATIONS

International Search Report for PCT Application No. PCT/JP2006/300570; mailed on Apr. 18, 2006.

* cited by examiner

*Primary Examiner*—Kevin M Nguyen
(74) *Attorney, Agent, or Firm*—Keating & Bennett, LLP

(57) ABSTRACT

A potential supplied from a capacitive load drive unit to one end of a respective capacitive load is switched to an intermediate potential between a first and a second power supply potentials for a predetermined period of time prior to switching the potential of the one end of the capacitive load from the first to the second power supply potential, or vice versa, which minimizes charging and discharging currents of the load, variations of the potential supplied to the capacitive load, and hence power consumption involved, without providing a charging capacitor having a large capacitance in the capacitive load drive unit.

18 Claims, 12 Drawing Sheets

FIG. 6 (a) CONVENTIONAL DRIVING SCHEME
PRIOR ART
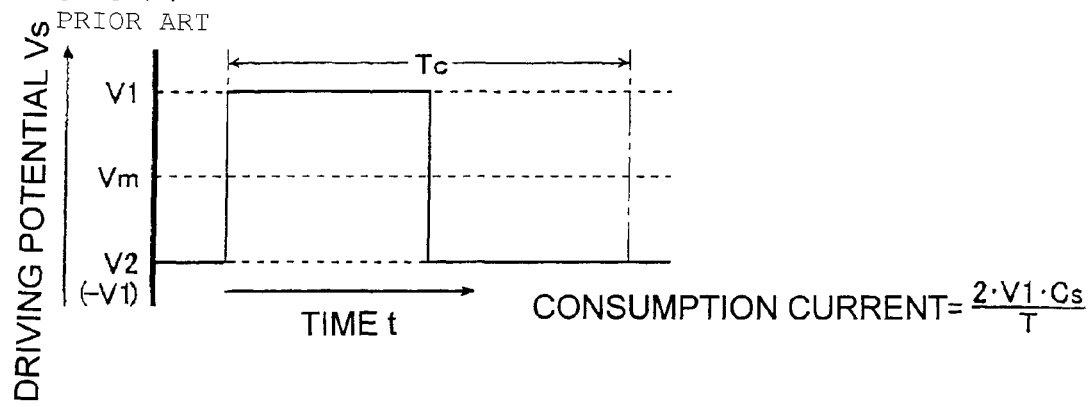
FIG. 6 (b) INVENTIVE DRIVING SCHEME (IDEAL)
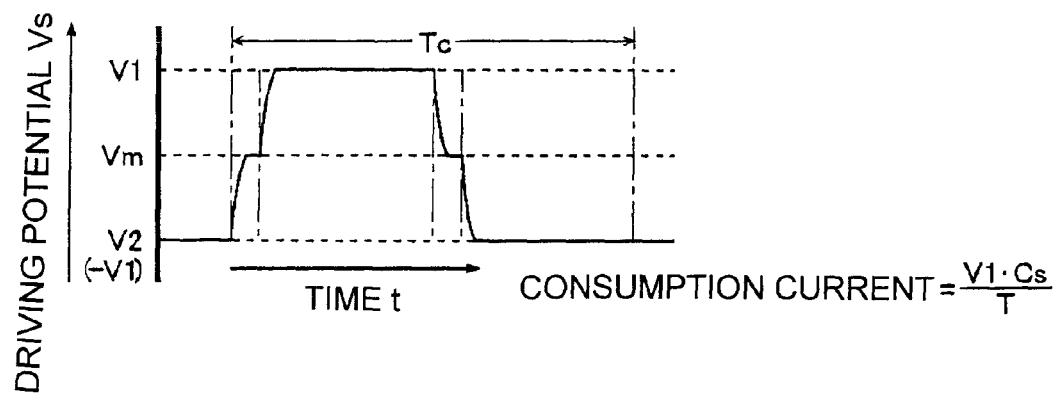
FIG. 6 (c) INVENTIVE DRIVING SCHEME (NON-IDEAL)
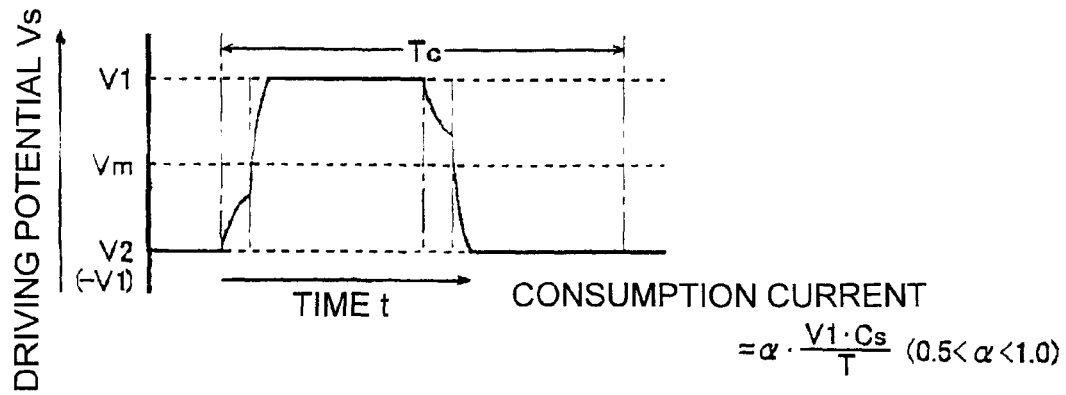

METHOD AND APPARATUS FOR DRIVING CAPACITIVE LOAD, AND LCD

BACKGROUND OF THE INVENTION

1. Field of the Invention

This invention relates to a method and a drive unit for driving a capacitive load such as a liquid crystal cell at different potentials, and to a liquid crystal display (LCD) utilizing the same.

2. Description of the Related Art

Conventionally, a capacitive load (typically a liquid crystal cell of an LCD) that is driven at different potentials has a structure as shown in FIG. 12 and at the timing as depicted in FIG. 13. As shown in FIG. 12, a typical capacitive load 40 is a liquid crystal cell of an LCD located at a point of intersection of a signal electrode and a scanning electrode of the LCD. The capacitive load 40 has a capacitance Cs.

Supplied to one end of the capacitive load 40 is a driving potential Vs, and to the other end thereof a reference potential Vc. When the capacitive load 40 is a liquid crystal cell, the driving potential Vs serves as a signal potential to be supplied to the signal electrode of the cell, while the reference potential Vc serves as a scanning potential to be supplied to the scanning electrode.

A first power supply circuit 10 generates a first power supply potential V1 to be supplied to the load. Such potential hereinafter referred to as power supply potential. The output end of the first power supply circuit 10 is connected to the one end of the capacitive load 40 via a first switching circuit 12. A second power supply circuit 20 generates a second power supply potential V2 which is lower than the first power supply potential V1. The output end of the second power supply circuit 20 is connected to one end of the capacitive load 40 via a second switching circuit 22. It should be understood that the first and second power supply circuits 10 and 20, respectively, have additional circuit elements, but in FIG. 12 they are simply represented by respective amplifiers 11 and 21.

As seen in FIG. 12, when the first switching circuit 12 is switched on and the second switching circuit 22 is switched off, the capacitive load 40 is charged to pull the driving potential Vs to the first power supply potential V1. On the other hand, when the second switching circuit 22 is switched on and the first switching circuit 12 is switched off, the capacitive load 40 is discharged to pull the driving potential Vs to the second power supply potential V2.

As shown in FIG. 13, when the driving potential Vs is changed from the second power supply potential V2 to the first power supply potential V1 at time t1, current I proportional to the difference between the first and the second potentials and the capacitance Cs (i.e. $I \propto |V1-V2| \times Cs$) flows through the first power supply circuit 10. Similarly, when the driving potential Vs is changed from the first power supply potential V1 to the second power supply potential V2 at time t2, current I proportional to the voltage difference $|V1-V2|$ and the capacitance Cs (i.e. proportional to $|V1-V2| \times Cs$), flows through the second power supply circuit 20. It is noted that in actuality the magnitude of the current I depends on the time constant determined by the capacitance Cs and the resistance of the current path involved, but it is always proportional to the voltage difference $|V1-V2|$.

As described above, the current I flows through the cell during charging/discharging the cell in cycles of a period of T, say. Every time the current I flows, there appears across the current path a potential drop proportional to the magnitude of the current I and the resistance of the current path. Such potential drop disadvantageously causes an adverse influence on the liquid crystal cell (e.g. degradation of display quality of the cell). In addition, since the current I is supplied from the first and second power supply circuits 10 and 20, respectively, inevitable power consumption of the current I takes place in these power supply circuits.

Conventionally, when the potential of the signal electrode is changed from a high potential to a lower potential, the signal electrode is temporarily connected to a charge storage capacitor having a sufficiently large capacitance than the capacitances associated with the signal electrode and a scanning electrode before the change, as disclosed in, for example, Japanese Patent Application Laid Open 2004-93951 (referred to as Patent Document 1). A further method of driving an LCD is disclosed in, for example, Japanese Patent Application Laid Open 2004-93951, in which a signal electrode is temporarily connected to a charging capacitor prior to switching the potential coupled to the signal electrode from a lower potential to a higher potential.

A still further method of driving a simple matrix LCD, related to the present invention, is disclosed in Japanese Patent Application Laid Open 2004-145185 (referred to as Patent Document 2), in which front-end and rear-end PWM signal voltages are applied to the respective signal electrodes associated with the respective scanning electrodes substantially at the same times over a predetermined period of time.

Admittedly, the prior art of Patent Document 1 enables reduction of power to drive an LCD. However, this prior art requires a charge storage capacitor of large capacitance which cannot be easily embedded in an IC chip together with a relevant power source circuit and switching circuits, so that the capacitor must be separately provided as a discrete component, thereby makes the drive disadvantageously large in size. Another problem arises in the use of such a charge storage capacitor as mentioned above that it requires dummy periods in addition to the scanning periods, which in turn requires controlling the driving potential supplied to the signal electrodes during the dummy periods.

The prior art technique of Patent Document 2 is directed to substantial elimination of the influence of noise voltages generated by rises and falls of a PWM-controlled signal voltage on a simple matrix LCD. In other words, the prior art cannot solve the problems discussed above.

SUMMARY OF THE INVENTION

In order to solve the problems described above, preferred embodiments of the present invention provide a method and a drive unit that enables driving capacitive loads without increasing the size of the drive unit, with reduced charging and discharge currents and with suppressed variations in the driving potential supplied to the capacitive loads, and hence at a reduced power consumption rate. Another preferred embodiment of the present invention provides an LCD equipped with such a drive unit.

In accordance with a preferred embodiment of the present invention, a method of driving multiple capacitive loads (the method hereinafter referred to as capacitive load driving method) capable of selectively supplying a first and a second power supply potentials to the respective ends of the multiple capacitive loads includes a step of connecting the respective ends of the multiple capacitive loads to a node of an intermediate potential between the first and second power supply potentials for a predetermined period of time prior to switching the potential of the respective ends of the multiple capacitive loads from the first to second potential, or vice versa.

In the inventive capacitive load driving method, the periods for supplying the first and second power supply potentials to the multiple capacitive loads (such periods hereinafter referred to as load driving periods) are either PWM modulated to lie at the front-end of a scanning period (front-end modulation) or PWM modulated to lie at the rear-end of a scanning period (rear-end modulation) such that the front-end modulation or rear-end modulation for at least one capacitive load is opposite in phase relative to those for other capacitive loads.

The front-end and rear-end modulations of any two neighboring capacitive loads may be opposite in phase.

The front-end and rear-end modulations for the respective capacitive loads may be alternated for every scanning period.

The node of an intermediate potential may be the output end of the power supply circuit generating the intermediate potential.

The node of an intermediate potential may be a grounded node.

A power supply unit for driving capacitive loads (the unit hereinafter referred to as capacitive load drive unit) in accordance with another preferred embodiment of the present invention includes a first power supply circuit arranged to generate a first potential to be supplied to the capacitive loads (the potential hereinafter referred to as first power supply potential); a second power supply circuit arranged to generate a second potential to be supplied to the capacitive loads (the potential hereinafter referred to as second power supply potential); a third power supply circuit arranged to generate a third potential to be supplied to the capacitive loads (the potential hereinafter referred to as third power supply potential) intermediate between the first and second power supply potentials; and output sections, each connected between the output ends of the first through third power supply circuits and the respective ends of associated capacitive loads and adapted to selectively supply either one of the first through third potentials to the respective ends of the associated capacitive loads, and each of the output sections further adapted to connect the respective ends of the associated capacitive loads to the output end of the third power supply circuit for a predetermined period of time prior to switching the potential of the respective ends of the associated capacitive loads from the first to second power supply potential, or vice versa.

A capacitive load drive in accordance with a further preferred embodiment of the present invention includes a first power supply circuit arranged to generate a positive first power supply potential; a second power supply circuit arranged to generate a negative second power supply potential; and output sections, each connected between both of a grounded node and the output ends of the first and second power supply circuits and the respective ends of associated capacitive loads and adapted to selectively supply either one of the first, second, and the ground potential to the respective ends of the associated capacitive loads, each of the output sections further adapted to connect the respective ends of the associated capacitive loads to the grounded node for a predetermined period of time prior to switching the potential of the respective ends of the associated capacitive loads from the first to second power supply potential, or vice versa.

In the capacitive load drive unit, the periods for supplying the first and second power supply potentials to the multiple capacitive loads may be either PWM-modulated to lie at the front-end of a scanning period (front-end modulation) or PWM-modulated to lie at the rear-end of a scanning period (rear-end modulation) such that the front-end modulation or rear-end modulation for at least one capacitive load is opposite in phase relative to those for other capacitive loads.

The front-end and rear-end modulations associated with any two neighboring output sections may be opposite in phase.

The front-end and rear-end modulations associated with the respective output sections may be alternated for every scanning period.

The first and second power supply potentials may be of the same magnitude in absolute value.

A liquid crystal display (LCD) in accordance with a still further preferred embodiment of the present invention includes an LCD panel having multiple capacitive loads in the form of liquid crystal cells inserted between multiple scanning electrodes and multiple signal electrodes; a scanning electrode driver arranged to sequentially scan the multiple scanning electrodes; a signal electrode driver arranged to supply a prescribed driving potential to each of the multiple signal electrodes in association with the scanning electrode scanned; and a power supply unit arranged to supply a set of potentials for driving a scanning electrode (the potentials hereinafter referred to as scanning electrode driving potentials) to the scanning electrode driver, and arranged to supply a set of potentials for driving the signal electrodes (the potentials hereinafter referred to as signal electrode driving potentials) to the signal electrode driver, the signal electrode driving potentials including a first power supply potential, a second power supply potential lower than the first power supply potential, and a third power supply potential between the first and second power supply potentials, the signal electrode driver having output sections, each connected between the respective ends of the first through third power supply potentials and the respective ends of associated liquid crystal cells and adapted to selectively supply either one of the first through third power supply potentials to the respective ends of the associated liquid crystal cells according to the display data inputted to the LCD, and each of the output sections adapted to connect the respective ends of the associated liquid crystal cells to the third power supply potential for a predetermined period of time prior to switching the potential of the respective ends of the associated liquid crystal cells from the first to the second power supply potential, or vice versa.

In the liquid crystal display, the periods for supplying the first and second power supply potentials to the multiple capacitive loads may be either PWM-modulated to lie at the front-end of a scanning period (front-end modulation) or PWM-modulated to lie at the rear-end of a scanning period (rear-end modulation) such that the front-end modulation or rear-end modulation for at least one liquid crystal cell is opposite in phase relative to those for other liquid crystal cells.

The front-end and rear-end modulations for any two neighboring output sections may be opposite in phase.

The front-end and rear-end modulations for the respective output sections may be alternated for every scanning period.

The third power supply potential may be the ground potential, and the first and second power supply potentials may be of the same magnitude in absolute value and opposite in polarity.

Preferred embodiments of the present invention can reduce the size of a capacitive load drive unit. Nevertheless, the present invention can reduce charging and discharging currents through capacitive loads, and hence the power consumption involved, and variations in the driving potential supplied to the loads as well.

It should be appreciated that the variations in the driving potential of liquid crystal cells of an LCD can be reduced while suppressing the degradation of display quality of an LCD.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIGS. 6(a)-6(c) illustrate typical behaviors of driving potentials Vs in a conventional, an ideal, and a non-ideal driving schemes.

DETAILED DESCRIPTION OF PREFERRED EMBODIMENTS

A method and a drive unit according to preferred embodiments of the present invention for driving capacitive loads and an LCD utilizing the same will now be described in detail with reference to the accompanying drawings.

Figure 1:
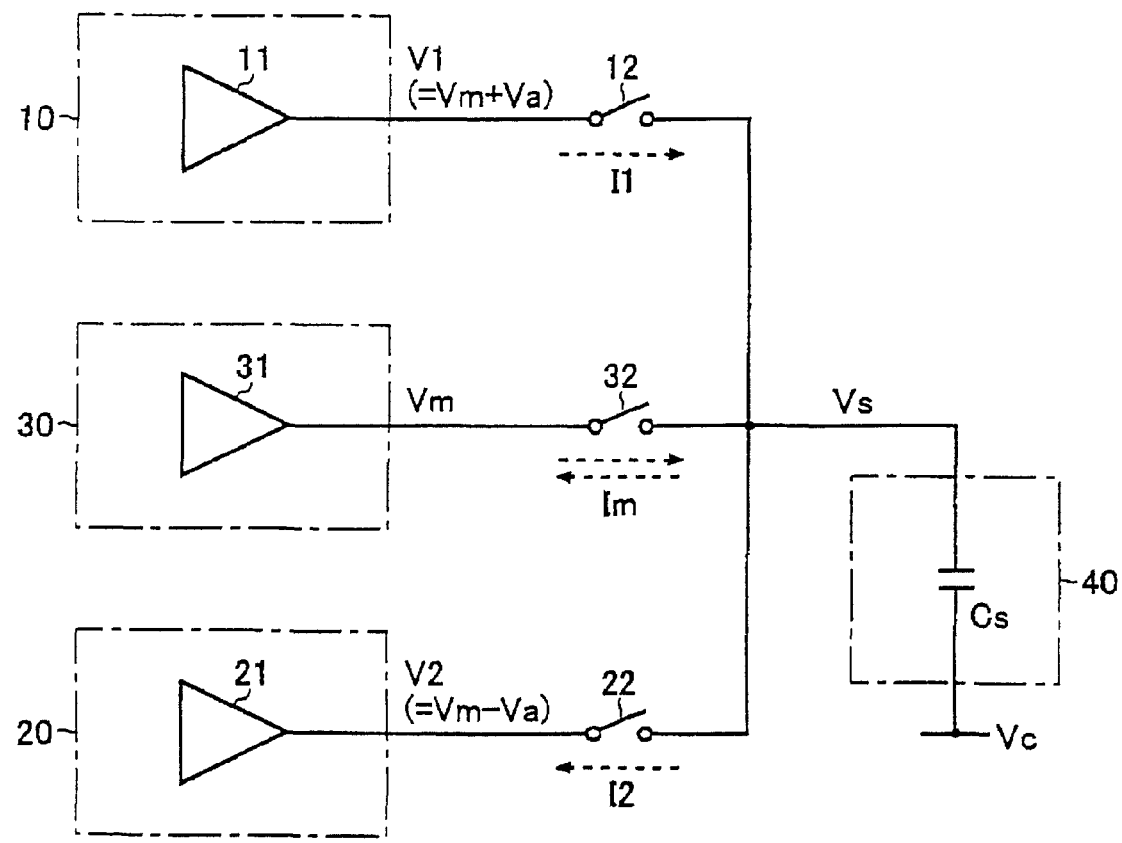
FIG. 1 is a circuit diagram of a drive unit for driving a capacitive load in accordance with a first preferred embodiment of the present invention.
Figure 2:
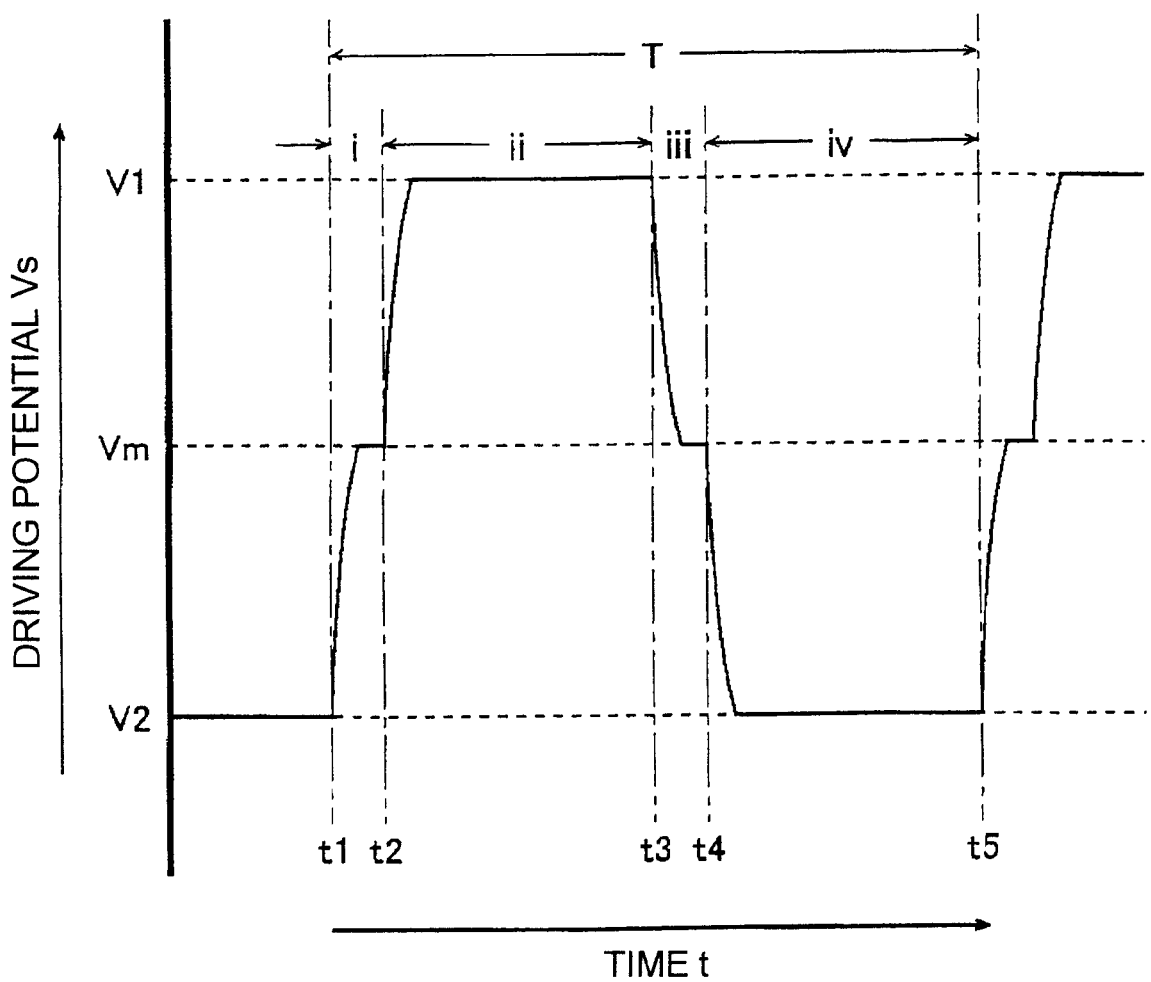
FIG. 2 is a timing diagram of the drive unit of FIG. 1.

Referring to FIG. 1, there is shown a drive unit for driving a capacitive load in accordance with a first preferred embodiment of the present invention. FIG. 2 is a timing diagram of the drive unit of FIG. 1.

A first power supply circuit 10 generates a first power supply potential V1 to be supplied to a capacitive load 40. The output end of the first power supply circuit 10 is connected to one end of the capacitive load 40 via a first switching circuit 12.

A second power supply circuit 20 generates a second power supply potential V2 lower than the first power supply potential V1. The output end of the second power supply circuit 20 is connected to the one end of the capacitive load 40 via a second switching circuit 22.

A third power supply circuit 30 generates a power supply potential Vm between the first power supply potential V1 and second power supply potential V2. The output end of the third power supply circuit 30 is also connected to the one end of the capacitive load 40 via a third switching circuit 32.

The third power supply potential Vm can be of any magnitude between the first and second power supply potentials V1 and V2, respectively, and preferably the mean potential (V1+V2)/2 of the two potentials V1 and V2.

In the example shown in FIG. 1, the third power supply potential Vm is set to the mean potential. In other words, the first power supply potential V1 equals the third power supply potential Vm plus a predetermined potential Va (i.e. V1=Vm+Va), and the second power supply potential V2 equals the third power supply potential Vm minus the predetermined potential Va (i.e. V2=Vm−Va).

It should be understood that although each of the first, second, and third power supply circuits 10, 20, and 30, respectively, has various relevant circuit elements, these power supply circuits are represented by respective amplifiers 11, 21, and 31 for simplicity.

The capacitive load 40 has a capacitance Cs. Supplied to one end of the capacitive load 40 is a driving potential Vs and, to another end thereof, a reference voltage Vc. This capacitive load 40 is, for example, a liquid crystal cell located at a position of intersection of a signal electrode and a scanning electrode of an LCD. When this is the case, the driving potential Vs is a signal potential supplied to the signal electrode, while the reference potential Vc is a scanning potential supplied to a scanning electrode.

The first switching circuit 12 is connected between the output end of the first power supply circuit 10 and one end of the capacitive load 40, so that the potential at the one end of the capacitive load 40 is pulled to the first power supply potential V1 when the switching circuit 12 is switched on. The second switching circuit 22 is connected between the output end of the second power supply circuit 20 and the one end of the capacitive load 40, so that the one end of the capacitive load 40 is pulled to the second power supply potential V2 when the switching circuit 22 is switched on. The third switching circuit 32 is connected between the output end of the third power supply circuit 30 and the capacitive load 40 such that the third switching circuit 32 is switched on for a predetermined period of time prior to switching on either one of the first switching circuit 12 and second switching circuit 22 which have been so far switched off.

It is seen in FIG. 1 that if the first switching circuit 12 is switched on and both the second switching circuit 22 and third switching circuit 32 are switched off, the capacitive load 40 is charged to pull the driving potential Vs to the first power supply potential V1. On the other hand, if the second switching circuit 22 is switched on and both the first switching circuit 12 and third switching circuit 32 are switched off, the capacitive load 40 is discharged to pull the driving potential Vs to the second power supply potential V2.

As seen in FIG. 2, there is provided a period <i> (from time t1 to t2) in which the driving potential Vs is temporarily set to the third power supply potential Vm when the driving potential Vs is to be changed from the second power supply potential V2 to the first power supply potential V1 at time t1. In this period <i>, the second switching circuit 22, which has been switched off up to t1, is switched on, so that only the third switching circuit 32 is switched on.

As a consequence, the driving potential Vs is changed from the second power supply potential V2 to the third power supply potential Vm, which causes current Im to flow from the third power supply circuit 30 to the capacitive load 40, where the current Im is proportional to the potential difference |V2−Vm| and the capacitance Cs (i.e. Im∝|V2−Vm|× Cs).

In actuality, however, the magnitude of the current Im depends on the potential difference (Vm−V2) generated when the driving potential is switched and on the time constant □ (=1/(Rs×Cs)) determined by the resistance Rs of the current path that includes the third power supply circuit 30 and the associated lead wires.

It is, therefore, preferable to set the period <i> longer than the time for the capacitive load 40 to be charged up to substantially the same potential as the third power supply potential Vm, that is, longer than the time for the current Im to diminish to substantial zero (Case 1). With this setting, when the circuit is switched on, the level of the current I1 through the first switching circuit 12 will, ideally, reduce to about one half (50%) that of the current I (100%) shown in FIG. 12. Accordingly, the resistive potential drop in the driving potential Vs associated with the current I1 and the resistance of the current path involved, and hence the power consumption by the first power supply circuit 10, can be decreased by 50%.

We now consider a converse case (Case 2) where the period <i> is set shorter than that as described above, so that the period <i> ends while the current Im is still flowing. In Case 2, the first power supply potential V1 is supplied to the capacitive load 40 before it is charged up to the third power supply potential Vm. Hence, a larger current I1 (than the current appearing in Case 1, but smaller than the current I shown in FIG. 12) flows from the first power supply circuit 10. Thus, in Case 2, both the variations in the driving potential Vs and power consumption in the first power supply circuit 10 can be decreased by 50-100%.

On the other hand, when the capacitive load 40 is a liquid crystal cell, the larger is the rate (i/T) of the period <i> to the period T of cycles (e.g. a period for scanning a selected scanning electrode (selection time)), the lower is the rms voltage supplied to the selected liquid crystal cell. For example, if the length of the period <i> is 1/128 of the period T, the rms voltage also decreases by about 1/128 of its original value.

Figure 12:
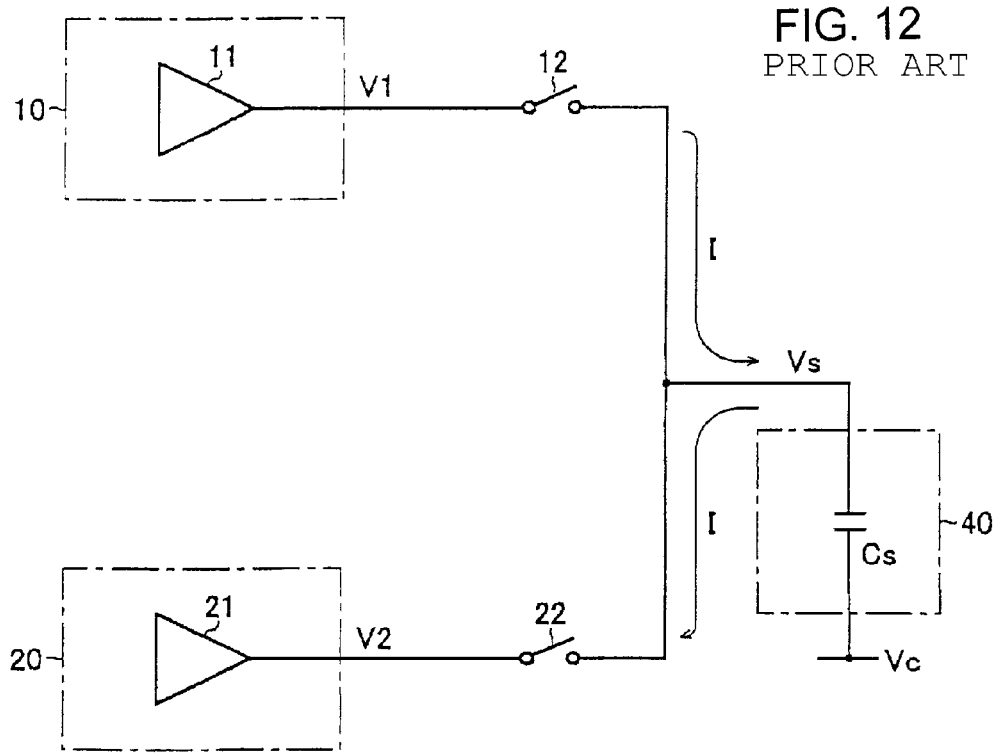
FIG. 12 shows an arrangement of a conventional capacitive load drive unit for driving a capacitive load.
Figure 13:
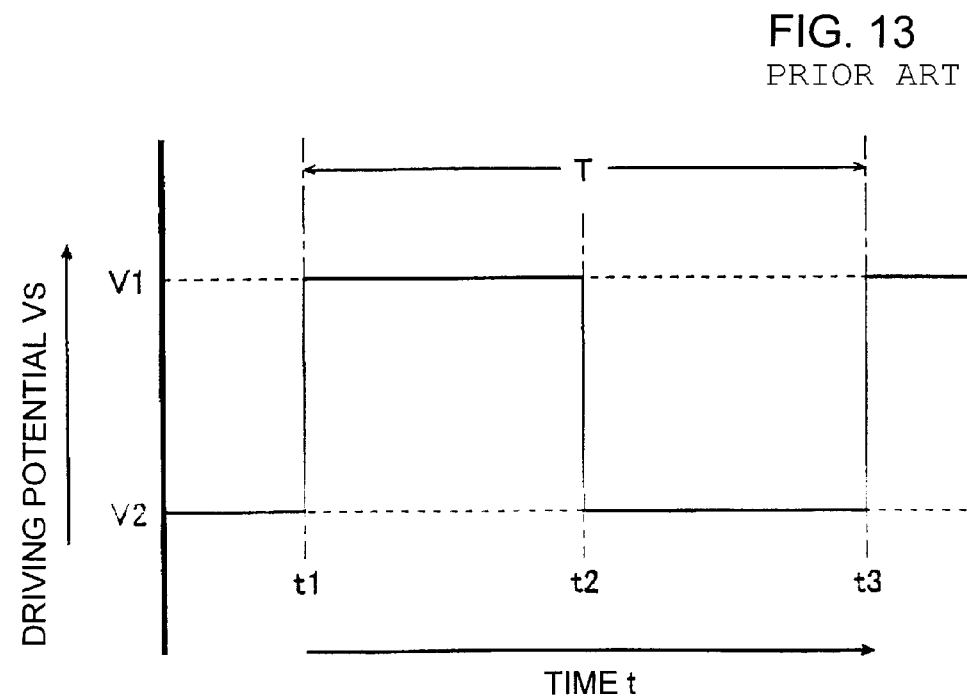
FIG. 13 is a timing diagram of the drive unit shown in FIG. 12.

As will be understood from the above discussion, an adequate length of the period <i> is a tradeoff between the reduction of the current consumption and the drop of the rms voltage. That is, when the reduction of current consumption be prioritized over the reduction of the rms voltage, the period <i> must be set sufficiently long to allow the current I to diminish to substantial zero. On the other hand, when the reduction of the rms voltage is prioritized, the length of the period <i> can be set to suppress the current consumption to less than 80% (preferably 70%) of the case where no period <i> is provided (e.g. conventional case as shown in FIG. 12). Thus, in this setting also, it is possible to reduce the power consumption to a greater degree than in the conventional setting shown in FIG. 12. Besides, a sufficient rms voltage can be supplied to the liquid crystal cell by appropriately shortening the period <i>.

The above description concerns with the period <i>. It will be understood that the same argument holds for the temporary period <iii> for setting the driving potential Vs to the third power supply potential Vm before the driving potential is changed from the first power supply potential V1 to the second power supply potential V2.

The third switching circuit 32, which has been so far switched on, is switched off at time t2, say, and only the first switching circuit 12 is switched on. This condition lasts for a period <ii>, say. As the first switching circuit 12 is switched on, the driving potential Vs then changes from the third power supply potential Vm to the first power supply potential V1. During this period, current I1, proportional to the potential difference |V1−Vm| and the capacitance Cs (i.e. I1∝|V1−V2|×Cs), flows from the first power supply circuit 10 to the capacitive load 40.

When the driving potential Vs is changed from the first power supply potential V1 to the second power supply potential V2 at time t3, say, a period <iii> (time t3 to time 4) similar to the period <i> is also provided to temporarily set the driving potential Vs to the third power supply potential Vm. During this period <iii>, the first switching circuit 12, which has been so far switched on, is switched off, and only the third switching circuit 32 is switched on.

As a consequence, the driving potential Vs changes from the first power supply potential V1 to the third power supply potential Vm, and current Im proportional to the potential difference and the capacitance Cs (i.e. Im∝|V1−Vm|×Cs) flows from the third power supply circuit 30 to the capacitive load 40.

The third switching circuit 32, which has been so far switched on, is switched off at time t4, say, and only the second switching circuit 22 is switched on. This condition lasts for a period <iv>. As the second switching circuit 22 is switched on, the driving potential Vs is then changed from the third power supply potential Vm to the second power supply potential V2. In this period, current I2 proportional to the potential difference |V2−Vm| and the capacitance Cs (i.e. I2∝|V1−Vm|×Cs) flows from the third power supply circuit 30 to the capacitive load 40.

Thus, in the capacitive load drive unit shown herein, the capacitive load 40 is connected to the output end of the third power supply circuit 30 so as to supply the third power supply potential Vm (preferably the mean potential) to the capacitive load 40 for a predetermined period of time before the driving potential Vs to be supplied to the capacitive load 40 is changed from first power supply potential V1 to the second power supply potential V2, or vice versa.

In this arrangement, since the currents Im, I1, and I2 that flow during switching of the driving potential Vs are all reduced to about one half of the current I of FIG. 12, variations in the driving potential Vs supplied to the capacitive load 40 are reduced accordingly. This implies that, in the case where liquid crystal cells of an LCD are driven by the capacitive load drive unit, degradation of the picture quality of the LCD can be suppressed.

Figure 3:
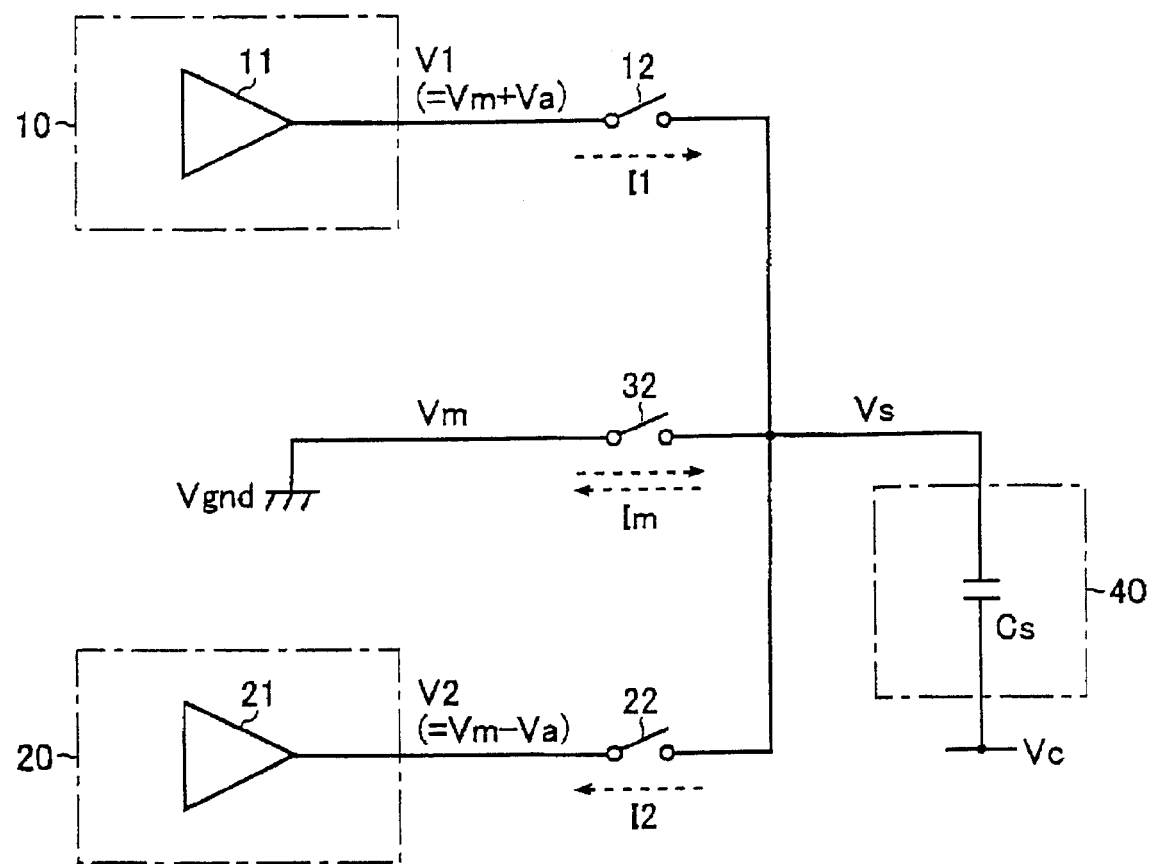
FIG. 3 is a circuit diagram of a drive unit for driving a capacitive load in accordance with a second preferred embodiment of the present invention.

Referring to FIG. 3, there is shown an arrangement of a capacitive load drive unit in accordance with a second preferred embodiment of the present invention. The timing diagram of the capacitive load drive unit is shown in FIG. 3, which is similar to that shown in FIG. 2.

In the second preferred embodiment shown in FIG. 3, a ground line is used in place of the third power supply circuit 30 of FIG. 1. As a consequence, the third power supply potential Vm is equal to the ground potential (or zero potential). Thus, if the first power supply potential V1 is positive, then second power supply potential V2 is negative. The first power supply potential V1 and the second power supply potential V2 are preferably opposite in polarity and have the same absolute value.

Operation of the second capacitive load drive unit is the same as that of the first preferred embodiment described in conjunction with FIGS. 1 and 2. It should be noted that since the third power supply potential Vm is taken to be the ground potential, no third power supply circuit is necessary. Hence, the second preferred embodiment has less power consumption than the first preferred embodiment described above.

It is noted that any resistive component such as a resistor may be inserted between the third switching circuit 32 and the ground line of FIG. 3.

Figure 4:
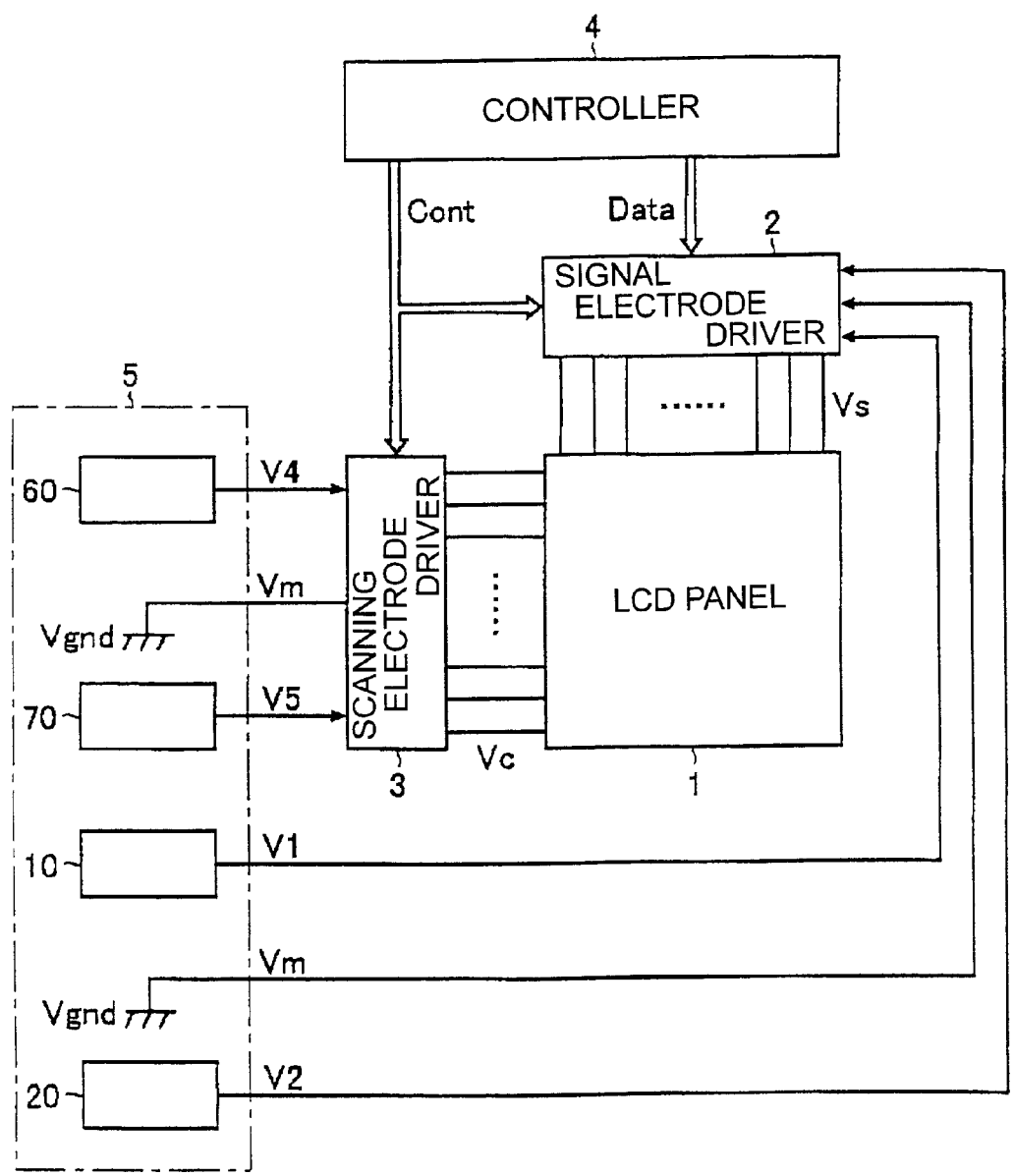
FIG. 4 is a circuit diagram of a drive unit for driving capacitive loads in accordance with a third preferred embodiment of the present invention.
Figure 5:
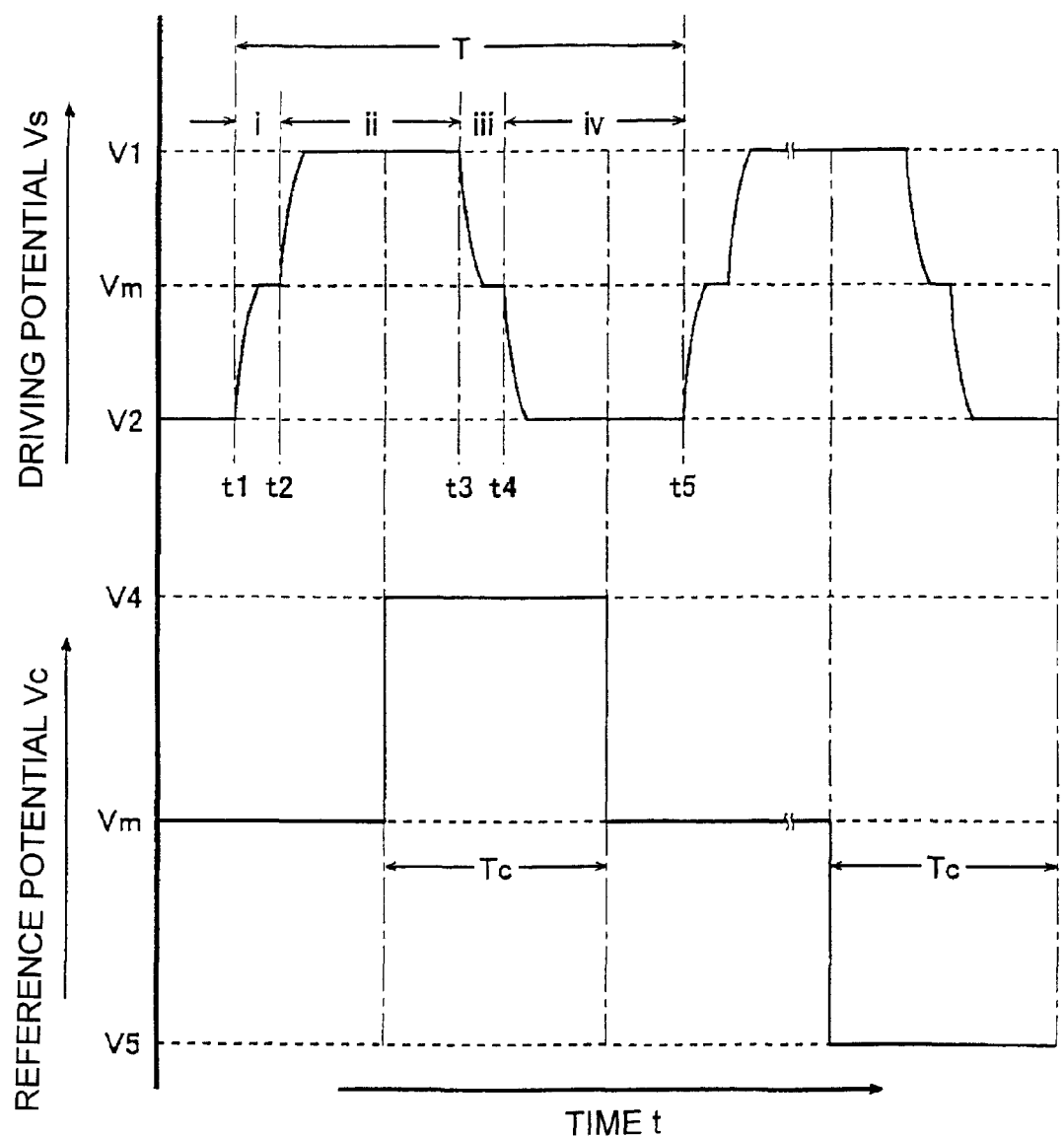
FIG. 5 is a timing diagram of the drive unit of FIG. 4.

Referring to FIG. 4, there is shown an LCD equipped with a capacitive load drive unit in accordance with a preferred embodiment of the present invention. FIG. 5 is a timing diagram of the capacitive load drive unit of FIG. 4.

An LCD panel 1 is, for example, a simple matrix LCD panel that is composed of multiple liquid crystal cells sandwiched between multiple signal electrodes and multiple scanning electrodes. The signal electrodes (signal lines) and scanning electrodes (scanning lines) are arranged such that each of the signal electrodes crosses respective scanning electrodes at a right angle.

A signal electrode driver 2 has multiple voltage output terminals each uniquely connected to an associated one of the signal electrodes of the LCD panel 1. Over a period for scanning any one selected scanning electrode, the signal electrode driver 2 sets the signal electrodes in a selected row associated with the scanning electrode to a driving potential Vs that is either the first power supply potential V1 or the second power supply potential V2 according to the display data defined for the respective pixels in the selected row.

A scanning electrode driver 3 has multiple voltage output terminals each uniquely connected to an associated one of the scanning electrodes of the LCD panel 1, and sequentially drives the scanning electrodes, one at a time. Normally, one scanning electrode for a selected row of signal electrodes is set to a selective potential, while the scanning electrodes for non-selected rows of signal electrodes are set to a non-selective potential. When driving the loads with a positive potential, the selected scanning electrode is set to a first selective potential which is a fourth power supply potential V4, and is set to a second selective potential which is a fifth power supply potential V5 when driving the loads with a negative potential. On the other hand, non-selected scanning electrodes are set to a non-selective potential which is the third power supply potential Vm. In this preferred embodiment, the third power supply potential Vm is assumed to be the ground potential (which is taken to be zero Volt).

A controller 4 supplies display data Data to the signal electrode driver 2, and supplies various control signals Cont for controlling the LCD to both the signal electrode drivers 2 and the scanning electrode driver 3.

A power supply unit 5 supplies to the signal electrode driver 2 a set of signal electrode potentials that includes the first power supply potential V1 generated by the first power supply circuit 10, the second power supply potential V2 generated by the second power supply circuit 20, and the third power supply potential Vm (ground potential Vgnd) of the ground line. In the example shown herein, the second power supply potential V2 is lower than the first power supply potential V1 and the third power supply potential Vm is an intermediate voltage between the first power supply potential V1 and the second power supply potential V2. Particularly, the first power supply potential V1 is positive and the second power supply potential V2 is negative, since the third power supply potential Vm is the ground potential Vgnd. The first power supply potential V1 and the second power supply potential V2 are preferably of the same magnitude in absolute value and opposite in polarity. These potentials V1, V2, and Vm for driving the signal electrodes are identical to the respective first through third power supply potentials V1, V2, and Vm of FIG. 3.

In the signal electrode driver 2, either one of these signal electrode driving potentials, V1, V2, and Vm, is selected as the driving potential Vs according to the control signal Cont and display data Data, and supplied it to the respective signal electrodes of the LCD panel 1.

A power supply unit 5 supplies to the scanning electrode driver 3 a set of scanning electrode driving potentials that includes the fourth power supply potential V4 generated by a fourth power supply circuit 60, fifth power supply potential V5 generated by a fifth power supply circuit 70, and the third power supply potential Vm (ground potential Vgnd). In the example shown herein, the fifth power supply potential V5 is lower than the fourth power supply potential V4, and the third power supply potential Vm is an intermediate potential between the fourth power supply potential V4 and the fifth power supply potential V5. In this example, the fourth power supply potential V4 is positive and the V5 is negative, since the third power supply potential Vm is the ground potential Vgnd. Preferably, the fourth power supply potential V4 and the fifth power supply potential V5 are of the same magnitude in absolute value and opposite in polarity. When an STN panel is used, the first and the fourth power supply potentials V1 and V4, respectively, are preferably set to be in the range from 2V1 to 15V1 based on a known bias optimization method.

In the scanning electrode driver 3, either one of these signal electrode driving potentials, V4, V5, and Vm, is selected as the reference potential (scanning potential) Vc according to the control signal Cont, and supplied to the respective signal electrodes of the LCD panel 1.

Referring to FIG. 5, operation of the liquid crystal display having an arrangement as described above will now be described. As indicated by a lower waveform shown in FIG. 5, selected one of the multiple scanning electrodes of the LCD panel 1 is supplied with the fourth power supply potential V4 (in the positive driving) or the fifth power supply potential V5 (in the negative driving) for a predetermined scanning period Tc. Every time the scanning period Tc has elapsed, the scanning electrode is switched over to the next one, to which the fourth power supply potential V4 or the fifth power supply potential V5 is supplied to continue sequential scanning of the scanning electrodes. It is noted that all the non-selected scanning electrodes are connected to the non-selective voltage, which is the third power supply potential Vm.

On the other hand, each of the multiple signal electrodes constituting the LCD panel 1 is supplied with the driving potential Vs, which is either one of the signal electrode driving potentials (first, second, and third power supply potentials V1, V2, and Vm, respectively) selected in accordance with the control signal Cont and display data Data.

The upper waveform of FIG. 5 illustrates a form of the driving potential Vs supplied to one signal electrode. Since the timing of changing the driving potential Vs of FIG. 5 is the same as that described in conjunction with FIG. 2, further description of FIG. 5 will be omitted.

In the operation described above, the potential difference between the driving potential Vs supplied to a respective signal electrode (signal line) and the driving potential Vc supplied to a respective scanning electrode (scanning line) is supplied to the liquid crystal cell (capacitive load) located at the position of intersection of both lines. Whether or not, and how long, a liquid crystal cell is turned on or off is determined by the voltage supplied to the cell.

In this LCD also, as in the first and second preferred embodiments described above, the driving potential Vs to be supplied to the respective signal electrodes is temporarily set to the third power supply potential Vm (ground potential Vgnd) for a predetermined period as shown in FIG. 5 prior to changing the power supply potential from the first power supply potential V1 to the second power supply potential V2, or vice versa.

In the LCD described above, the intermediate potential (third power supply potential Vm) temporarily provided in the course of changing the driving potential Vs is set to the ground potential Vgnd, and so is the potential of non-selected scanning electrodes.

This arrangement can reduce not only charging and discharging currents through the liquid crystal cells but also variations in the driving potential Vs during charging and discharging the liquid crystal cells. Reduction of the variations in the driving potential Vs helps improve display quality of the LCD. It is noted that the power supply unit 5 can be formed of only four power supply circuits (first, second, fourth, and fifth power supply circuits 10, 20, 60, and 70, respectively) to supply six power supply potentials required by the LCD panel 1. In this way, this preferred embodiment of the present invention can advantageously reduce the number of power supply circuits of the power supply unit 5, and hence currents through the unit during charging and discharging of the liquid crystal cells. As a result, power consumption by the unit 5 can be reduced.

It will be apparent, however, that the present invention is not limited to the arrangement of the power supply unit 5. For example, the power supply unit 5 can be provided with a further power supply circuit for generating a potential other than the intermediate potential or the non-selective potential.

In order to control the tone of a respective liquid crystal cell of the LCD panel 1, the driving potential Vs supplied to the signal electrode of cell may be pulse-width modulated (PWM) as shown in FIG. 5.

As described above, the inventive method of driving capacitive loads can reduce consumption current supplied from the power supply unit 5 (particularly, first and second power supply circuits 10 and 20, respectively) during the on-off operation of the liquid crystal cells of the LCD panel 1, ideally by a factor of ½ (See FIGS. 6(*a*) and (*b*)).

In actuality, however, there can be cases where, under various use conditions, the driving potential Vs fails to reach the third power supply potential Vm (=Vgnd) within a period in which the liquid crystal cells (capacitive loads) are connected to the ground line as shown in FIG. 6(*c*). A reason for this will now be discussed with reference to FIG. 7.

Figure 7:
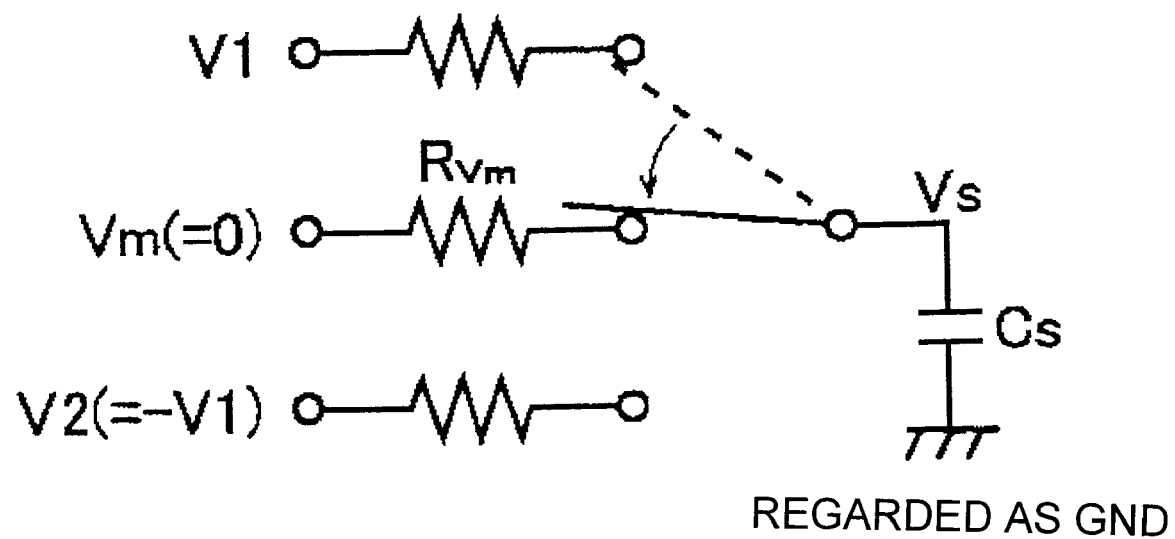
FIG. 7 illustrates a principle for reduction of consumption current.

FIG. 7 is a circuit diagram illustrating a principle for reduction of the consumption current, the diagram showing an equivalent circuit of a capacitive load drive unit with a common line (FIG. 7) being regarded as the ground line for AC current.

Suppose for example that one end of a capacitive load, coupled to the first power supply potential V1 serving as the driving potential Vs, is connected to the ground line (providing the third power supply potential Vm=Vgnd) as shown in FIG. 7 at time t=0. The driving potential Vs(t) at time t later will be given by Eq. (1) below. The amount of charge Q required to bring the driving potential Vs(t) to the second power supply potential V2 (=−V1) (or, equivalently, consumption current through the second power supply circuit 20) will be given by Equation (2) below.

$$Vs(t)=V1 \cdot \exp\{-t/(Cs \cdot Rvm)\} \quad (1)$$

$$|Q|=Cs \cdot |V1| \cdot [1+\exp\{-t/(Cs \cdot Rvm)\}] \quad (2)$$

From Eq. 2 it is seen that parameters that delay attenuation of the consumption current are:

(a) large capacitance Cs of the capacitive load (liquid crystal cell);

(b) large resistance Rvm that exists between the ground line and the capacitive load; and (c) short "connection time" (which is the "time t" stated above) for connecting the capacitive load to the ground line.

The parameter (a), however, is determined by the liquid crystal cell, and the parameter (b) depends on the conditions of peripheral devices. The parameter (c) (the connection time) may be varied, but it will have an adverse influence on the picture quality of the cell if it is set too long. Therefore, those parameters (a)-(c) have little degrees of freedom of modification.

Figure 8:
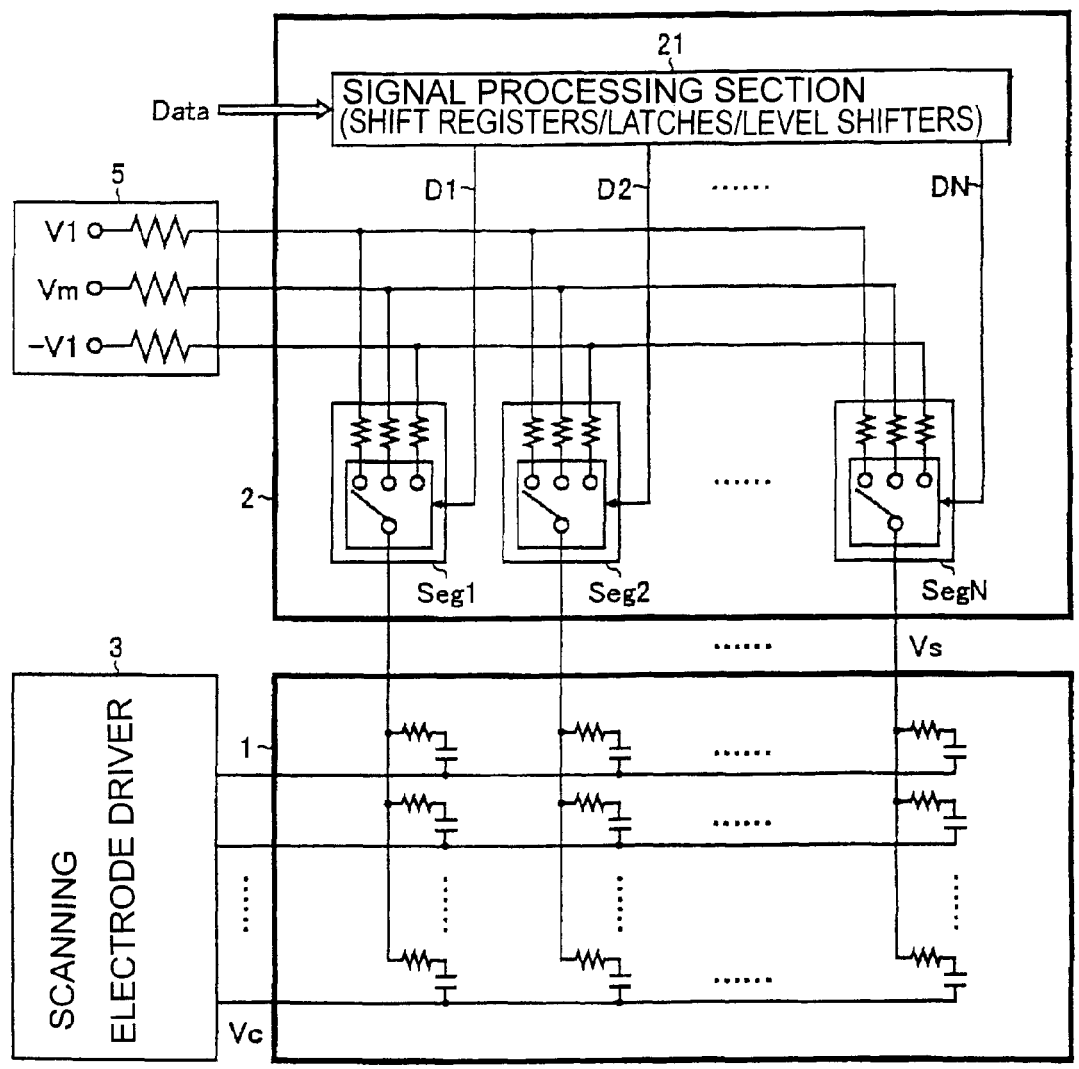
FIG. 8 shows an exemplary arrangement of a signal electrode driver 2.

On the other hand, one may notice, by looking at the LCD panel 1 from a different point of view, that the LCD panel 1 has a dot matrix structure in which a signal electrode driver 2 consists of N ($\geq$2) segments, Seg1 through SegN, each being independently operable in response to display data Data supplied from the controller 4 (more specifically, segment-wise display data D1-DN supplied from a signal processing unit 21) of the signal electrode driver 2 as shown in FIG. 8.

Figure 9:
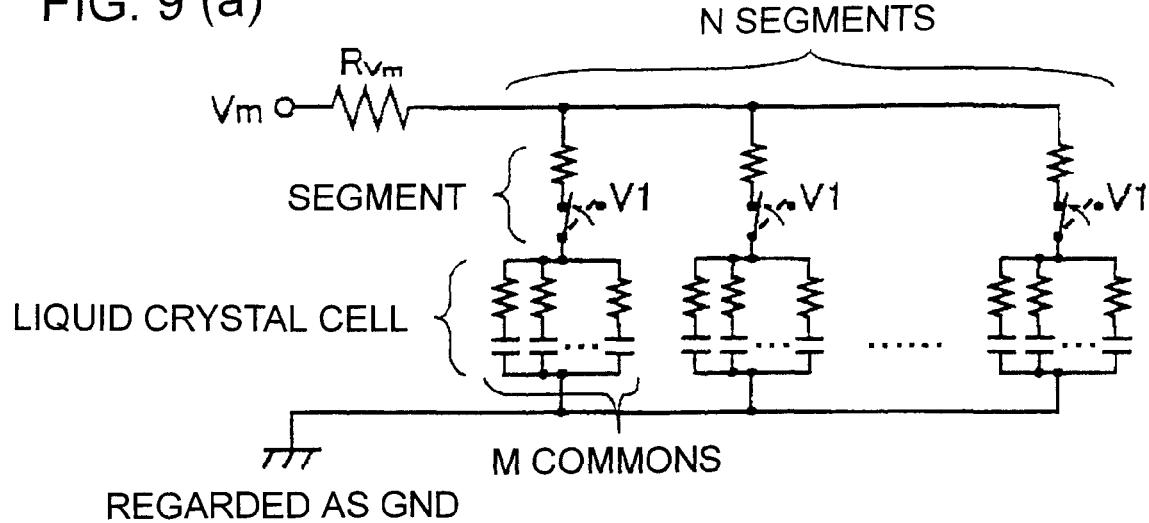
FIGS. 9(a)-9(c) show equivalent circuit of the segments undergoing simultaneous transitions from a first potential V1 to a third potential Vm.
Figure 9:
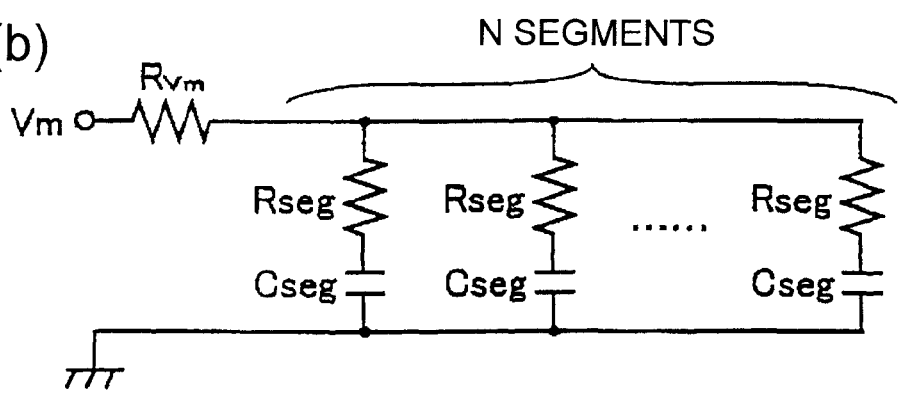
Figure 9:
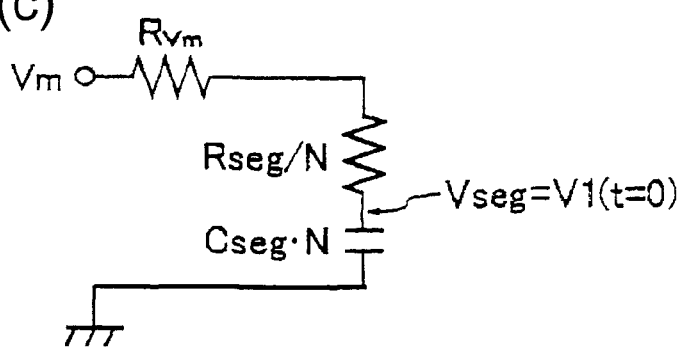

It is noted that, in the case where all of the potentials supplied to the N segments Seg1-SegN are simultaneously changed from the same potential (e.g. the first power supply potential V1) to the third power supply potential Vm, the N-segment signal electrode driver 2 can be represented by an equivalent circuit as shown in FIG. 9(*c*), provided that the common line for M common can be regarded as the ground line GND for AC current. FIGS. 9(*a*) and (*b*) illustrate a step of getting the equivalent circuit shown in FIG. 9(*c*). The resistances Rseg and capacitances Cseg of each segment indicated in FIG. 9 (*b*) and (*c*) represents the total resistance and the total capacitance of the segment, based on the assumption that all the segments have the same resistance and the same capacitance.

Therefore, from the equivalent circuit of FIG. 9(*c*) and Eq. (1) above, the potential Vseg(t) appearing at one end of the capacitive load (liquid crystal cell) at time t subsequent to the simultaneous change is given by $$Vseg(t)=V1 \cdot \exp[-t/\{Cseg \cdot N \cdot (Rvm+Rseg/N)\}]= V1 \cdot \exp[-t/\{Cseg \cdot (Rvm \cdot N+Rseg)\}] \quad (3)$$

assuming that Vseg(0)=V1.

It can be seen from Eq. (3) that the larger is the number N of the segments at the same potential that are simultaneously connected to the third power supply potential Vm (=Vgnd), the greater becomes the resistive impedance Rvm·N, since the common impedance RVm is multiplied by N, which hinders attenuation of Vseg(t) to zero.

As described above, the segments Seg1-SegN are controlled by the display data Data supplied from the controller 4 (or rather, controlled by the segment-wise display data D1-DN supplied from the signal processing unit 21).

Consequently, if the PWM control of the driving periods is performed to provide front-end (or alternatively rear-end) modulations for all the N segments Seg1-SegN, then, in the worst case, all of the N segments Seg1-SegN held at the same potential can be simultaneously connected to the third power supply potential Vm (=Vgnd) by a certain display data Data.

It will be recalled that in the front-end modulation a predetermined power supply potential is supplied to a load for a prescribed period from the beginning of a scanning period Tc of the PWM up to an intermediate point of time in the period TCon the other hand, in the rear-end modulation, the potential is supplied from an intermediate point of time up to the end of the period Tc.

Figure 10:
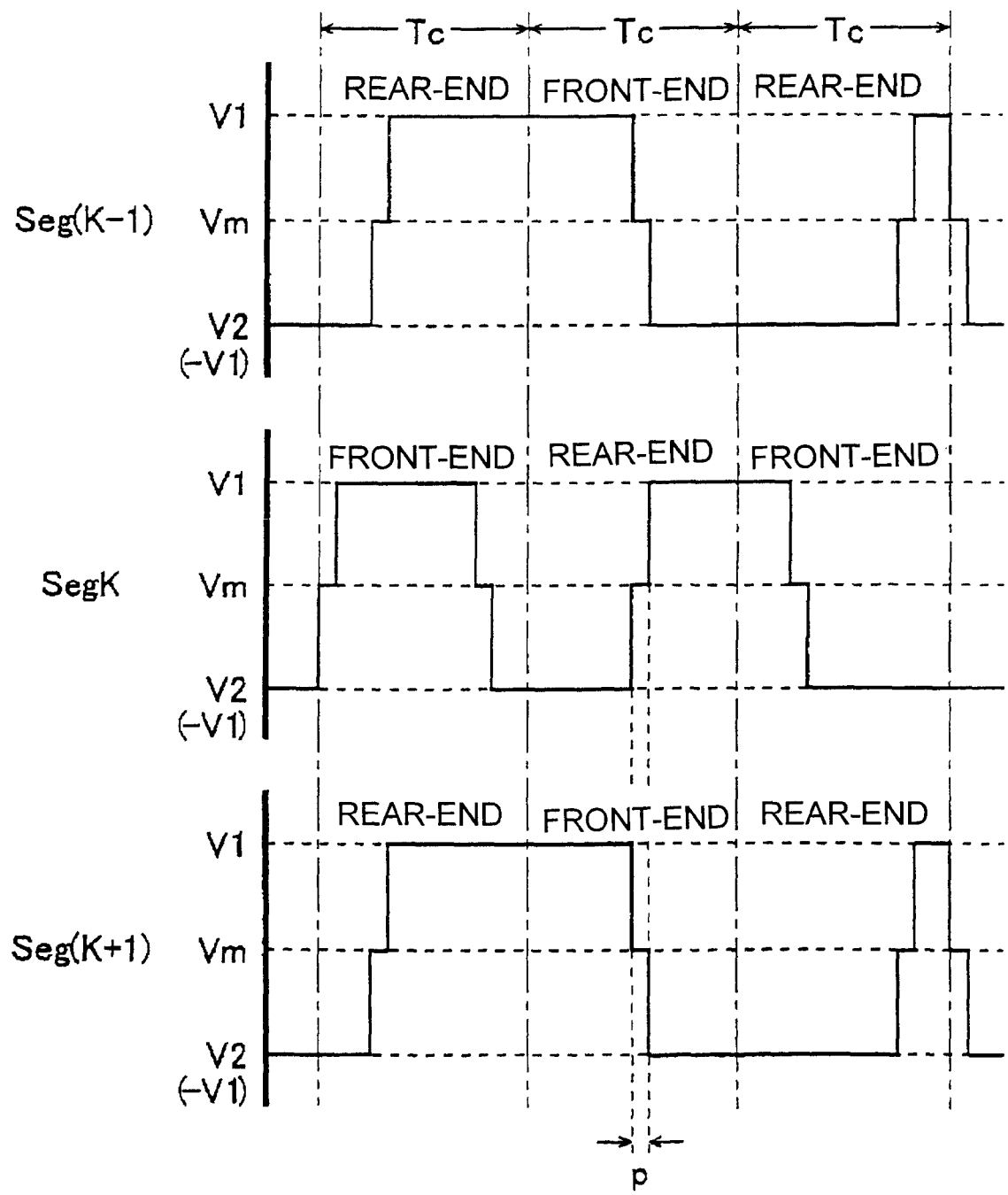
FIG. 10 is a timing diagram of PWM control of the load driving periods for neighboring segments.

In the LCD shown herein, therefore, in order to reduce the number of segments that are simultaneously switched from the same potential to the third power supply potential Vm (=Vgnd), front-end modulation and rear-end modulations are alternately imposed on the driving periods for N segments (or N liquid crystal cells) in opposite phases as shown in FIG. 10.

More particularly, if the Kth segment SegK, say, is supplied with the first and second power supply potentials V1 and V2, respectively, in the sequential scanning periods Tc's under front-end modulation, rear-end modulation, front-end modulation, and so on, then the neighboring (K−1)st and (K+1)st segments, Seg(K−1) and Seg(K+1), respectively, are supplied with the first and second power supply potentials V1 and V2, respectively, under rear-end modulation, front-end modulation, front-end modulation, and so on.

In such a capacitive load driving method as described above, the number of the segments at the same potential that are simultaneously connected to the third power supply potential Vm (=Vgnd) is at worst one half (N/2) the total number N of the segments.

Figure 11:
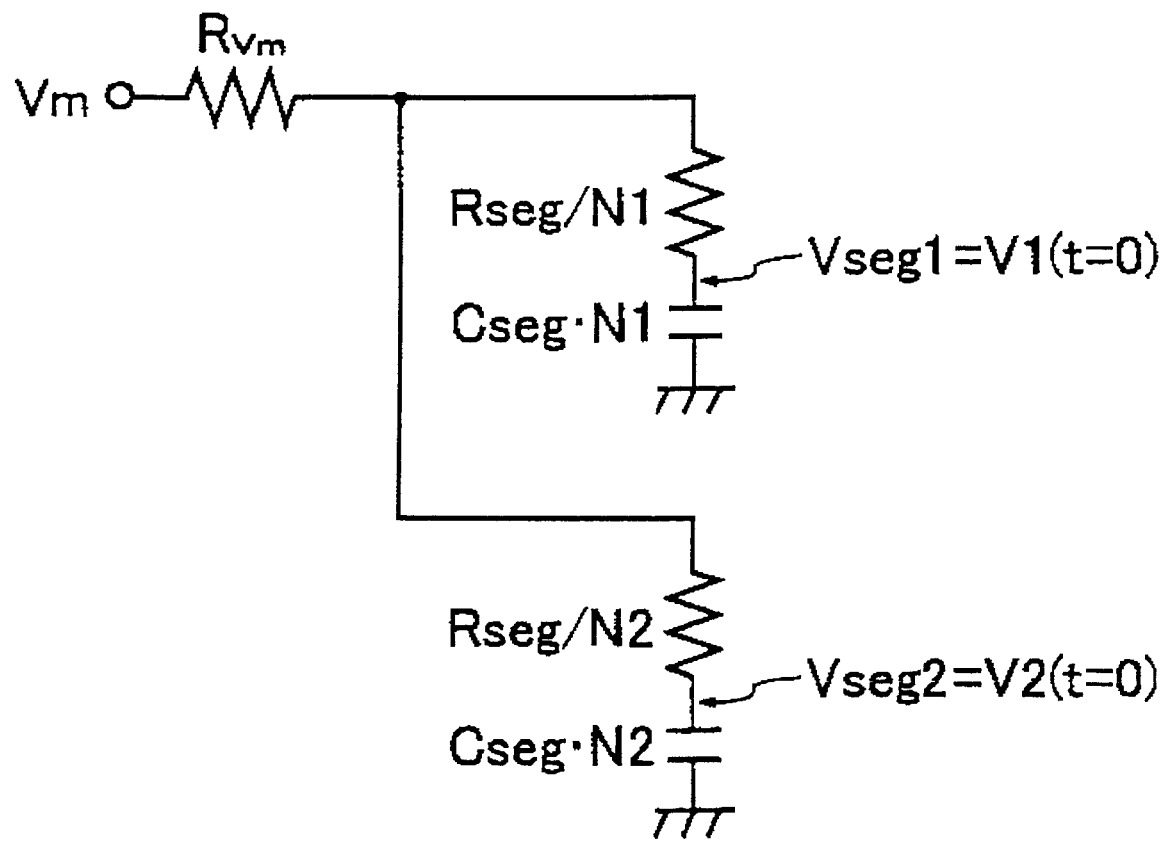
FIG. 11 is an equivalent circuit of the segments undergoing simultaneous changes from a first potential V1 to a third potential Vm and from a second potential V2 to the third potential Vm.

In a drive unit utilizing the capacitive load driving method of a preferred embodiment of the present invention (see FIG. 11), there is a chance that a segment receiving the first power supply potential V1 and a segment receiving the second power supply potential (=−V1) are simultaneously connected to the third power supply potential Vm (=Vgnd) for a certain period of time, e.g. period p as shown in FIG. 10. In this case, the first and second power supply circuits can withdraw current from each other via a short-circuited current path between them. As a result, consumption current can be reduced to a greater degree than in a drive unit which is configured to allow the first and second power supply circuits to be individually connected to the third power supply potential Vm. In order to enhance reduction of the consumption current, it is preferable to provide front-end and rear-end modulations in opposite phases for neighboring segments, as is done in this embodiment.

As seen in the above description, an LCD panel 1 in accordance with this preferred embodiment can further lower the worst possible level of the consumption current, than in the preceding preferred embodiments where PWM control of the load driving periods of all the segments Seg1-SegN provides front-end modulated or rear-end modulation for all the segments simultaneously. Further, instant drop of the driving potential Vs is suppressed, so that the clarity of the liquid crystal display panel can be improved.

It is noted that in this LCD panel the front-end modulation and rear-end modulation for a respective segment are switched over for every scanning period Tc as shown in FIG. 10. A drive unit utilizing this capacitive load driving method can better improve current utilization efficiency than those performing PWM control to provide front-end modulation (or rear-end modulation) for all the segments simultaneously.

The present invention has been described above with particular reference to preferred LCDs. However, the present invention will not be limited to these examples and encompasses all modifications of the method and the drive unit described above adapted to drive capacitive loads at different potentials.

It will be apparent to those skilled in the art that the arrangements of various preferred embodiments of the present invention described above can be altered within the scope of the present invention without departing from the spirit of the invention. For example, in contrast to the foregoing example where driving periods of any two neighboring segments (liquid crystal cells) are subject to either front-end or rear-end modulation in opposite phases, front-end or rear-end modulation can be performed for at least one liquid crystal cell (capacitive load) in the opposite phase relative to those of other liquid crystal cells (capacitive loads).

A method and a drive unit according to preferred embodiments of the present invention enables driving of multiple capacitive loads with reduced charging and discharging currents and with reduced variations in the power supply potentials supplied to the loads without implementing a charging capacitor having a large capacitance, thereby reducing the power consumption involved. An LCD according to a preferred embodiment of the present invention can operate with reduced charging and discharging currents and reduced variations in the power supply potentials supplied thereto, and hence with a reduced power consumption rate, without requiring a charging capacitor having a large capacitance. Preferred embodiments of the present invention are, therefore, suitable for driving multiple capacitive loads, such as liquid crystal cells, operable at different potentials.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A capacitive load drive unit, comprising:
   a first power supply circuit arranged to generate a first power supply potential;
   a second power supply circuit arranged to generate a second power supply potential lower than said first power supply potential;
   a third power supply circuit arranged to generate a third intermediate power supply potential between said first and second power supply potentials;
   a capacitive load, one end of which is connected to a reference potential;
   a first switch arranged to open and close between an output end of said first power supply circuit and another end of the capacitive load;
   a second switch arranged to open and close between an output end of said second power supply circuit and said another end of the capacitive load; and
   a third switch arranged to open and close between an output end of said third power supply circuit and said another end of the capacitive load; wherein
   when a potential applied to said another end of the capacitive load is switched from said first power supply potential to said second power supply potential, the switching proceeds by transitioning
      from a first state in which said first switch is closed, said second switch is open, and said third switch is open,
      via a second state in which said first switch is open, said second switch is open, and said third switch is closed, and
      to a third state in which said first switch is open, said second switch is closed, and said third switch is open; and
   when the potential applied to said another end of the capacitive load is switched from said second power supply potential to said first power supply potential, the switching proceeds by transitioning
      from the third state in which said first switch is open, said second switch is closed, and said third switch is open,
      via the second state in which said first switch is open, said second switch is open, and said third switch is closed, and
      to the first state in which said first switch is closed, said second switch is open, and said third switch is open.

2. The capacitive load drive unit in accordance with claim 1, wherein
   said capacitive load comprises multiple capacitive loads; and the periods for supplying said first and second power supply potentials to said multiple capacitive loads are either front-end modulated in PWM to lie at the front-end or rear-end modulated in PWM to lie at the rear-end of a respective scanning period, such that the front-end modulation or rear-end modulation of at least one of the multiple capacitive loads is opposite in phase relative to the rest of said multiple capacitive loads.

3. The capacitive load drive unit in accordance with claim 1, wherein
said first power supply potential is a positive power supply potential;
said second power supply potential is a negative power supply potential; and
said third power supply potential is a ground potential.

4. The capacitive load drive unit in accordance with claim 1, wherein the reference potential is one of a fourth power supply potential, a fifth power supply potential lower than said fourth power supply potential, and a sixth power supply potential having an intermediate potential level between said fourth and fifth power supply potentials.

5. The capacitive load drive unit in accordance with claim 2, wherein said front-end and rear-end modulations associated for any two neighboring output sections are opposite in phase.

6. The capacitive load drive unit in accordance with claim 2, wherein said front-end and rear-end modulations for said respective output sections are alternated for every scanning period.

7. The capacitive load drive unit in accordance with claim 5, wherein said front-end and rear-end modulations for said neighboring output sections are alternated for every scanning period.

8. The capacitive load drive unit in accordance with claim 3, wherein
said capacitive load comprises multiple capacitive loads; and
the periods for supplying said first and second power supply potentials to said multiple capacitive loads are either front-end modulated in PWM to lie at the front-end of a respective scanning period or rear-end modulated in PWM to lie at the rear-end of a respective scanning period such that the front-end modulation or rear-end modulation for at least one of said multiple capacitive loads is opposite in phase relative to those of the rest of said multiple capacitive loads.

9. The capacitive load drive unit in accordance with claim 3, wherein said first and second power supply potentials are of the same magnitude in absolute value.

10. The capacitive load drive unit in accordance with claim 4, wherein said second state lasts until a voltage at one end of the capacitive load to which said second power supply potential is applied becomes equal to the second power supply potential.

11. The capacitive load drive unit in accordance with claim 1, wherein said second state lasts until a voltage at one end of the capacitive load to which said second power supply potential is applied becomes equal to the second power supply potential.

12. A liquid crystal display, comprising:
a liquid crystal display panel having multiple capacitive loads in the form of liquid crystal cells inserted between multiple scanning electrodes and multiple signal electrodes;
a scanning electrode driver arranged to sequentially scan said multiple scanning electrodes;
a signal electrode driver arranged to supply a prescribed driving potential to each of said multiple signal electrodes in association with the scanning electrode scanned; and
a power supply unit arranged to supply a set of scanning electrode driving potentials to said scanning electrode driver, and for supplying a set of signal electrode driving potentials to said signal electrode driver; wherein
said power supply unit comprises:
a first power supply circuit arranged to generate a first power supply potential;
a second power supply circuit arranged to generate a second power supply potential lower than said first power supply potential; and
a third power supply circuit arranged to generate a third intermediate power supply potential between said first and second power supply potentials,
said signal electrode driver comprises:
a first switch arranged to open and close between an output end of said first power supply circuit and another end of the capacitive load;
a second switch arranged to open and close between an output end of said second power supply circuit and said another end of the capacitive load; and
a third switch arranged to open and close between an output end of said third power supply circuit and said another end of the capacitive load;
when a potential applied to said another end of the capacitive load is switched from said first power supply potential to said second power supply potential, the switching proceeds by transitioning
from a first state in which said first switch is closed, said second switch is open, and said third switch is open,
via a second state in which said first switch is open, said second switch is open, and said third switch is closed, and
to a third state in which said first switch is open, said second switch is closed, and said third switch is open; and
when the potential applied to said another end of the capacitive load is switched from said second power supply potential to said first power supply potential, the switching proceeds by transitioning
from the third state in which said first switch is open, said second switch is closed, and said third switch is open,
via the second state in which said first switch is open, said second switch is open, and said third switch is closed, and
to the first state in which said first switch is closed, said second switch is open, and said third switch is open.

13. The liquid crystal display in accordance with claim 12, wherein the periods for supplying said first and second power supply potentials to said multiple capacitive loads are either front-end modulated in PWM to lie at the front-end of a respective scanning period or rear-end modulated in PWM to lie at the rear-end, of a respective scanning period, such that the front-end modulation or rear-end modulation of at least one liquid crystal cell is opposite in phase relative to those of the rest of said liquid crystal cells.

14. The liquid crystal display in accordance with claim 13, wherein said front-end and rear-end modulations for any two neighboring output sections are opposite in phase.

15. The liquid crystal display in accordance with claim 13, wherein said front-end and rear-end modulations for the respective output sections are alternated for every scanning period.

16. The capacitive load drive unit in accordance with claim 13, wherein
  said first power supply potential is a positive power supply potential;
  said second power supply potential is a negative power supply potential; and
  said third power supply potential is a ground potential.

17. The liquid crystal display in accordance with claim 12, wherein said third power supply potential is the ground potential, and said first and second power supply potentials are of the same magnitude in absolute value but opposite in polarity.

18. The capacitive load drive unit in accordance with claim 12, wherein said second state lasts until a voltage at one end of said liquid crystal cells to which said second power supply potential is applied becomes equal to the second power supply potential.

* * * * *